US009741422B1

United States Patent
Park et al.

(10) Patent No.: US 9,741,422 B1
(45) Date of Patent: Aug. 22, 2017

(54) DEVICE FOR CONTROLLING A REFRESH OPERATION TO A PLURALITY OF BANKS IN A SEMICONDUCTOR DEVICE

(71) Applicant: SK hynix Inc., Icheon-si, Gyeonggi-do (KR)

(72) Inventors: Min Su Park, Seoul (KR); Jae Il Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 36 days.

(21) Appl. No.: 15/170,554

(22) Filed: Jun. 1, 2016

(30) Foreign Application Priority Data

Feb. 22, 2016 (KR) .................. 10-2016-0020579

(51) Int. Cl.
| | |
|---|---|
| *G11C 7/00* | (2006.01) |
| *G11C 11/406* | (2006.01) |
| *G11C 11/408* | (2006.01) |
| *G11C 7/22* | (2006.01) |
| *G11C 7/10* | (2006.01) |

(52) U.S. Cl.
CPC .... *G11C 11/40618* (2013.01); *G11C 11/4082* (2013.01); *G11C 11/4087* (2013.01); *G11C 7/1051* (2013.01); *G11C 7/1078* (2013.01); *G11C 7/22* (2013.01)

(58) Field of Classification Search
CPC ............ G11C 7/1051; G11C 7/78; G11C 7/22
USPC .................. 365/189.05, 222, 200
See application file for complete search history.

(56) References Cited

U.S. PATENT DOCUMENTS

| | | | | |
|---|---|---|---|---|
| 5,999,472 | A * | 12/1999 | Sakurai | G11C 11/40618 365/222 |
| 8,638,626 | B2 | 1/2014 | Yang et al. | |
| 2003/0107939 | A1* | 6/2003 | Yoon | G11C 11/406 365/222 |
| 2006/0098504 | A1* | 5/2006 | Takita | G11C 11/406 365/200 |

FOREIGN PATENT DOCUMENTS

KR        1020110131634 A      12/2011

\* cited by examiner

*Primary Examiner* — Connie Yoha
(74) *Attorney, Agent, or Firm* — William Park & Associates Ltd.

(57) ABSTRACT

A refresh control device may include a plurality of latch circuits configured to receive an active signal, a refresh signal, an active control signal, and a refresh control signal, and output a word line enable signal for controlling a refresh operation to banks. The refresh control device may include a command decoder configured to decode a row address in correspondence to an external command signal and generate the active signal and the refresh signal. The refresh control device may include an address buffer configured to buffer an active address and generate the active control signal. The refresh control device may include an address control circuit configured to generate the refresh control signal in correspondence to a refresh command signal.

18 Claims, 4 Drawing Sheets

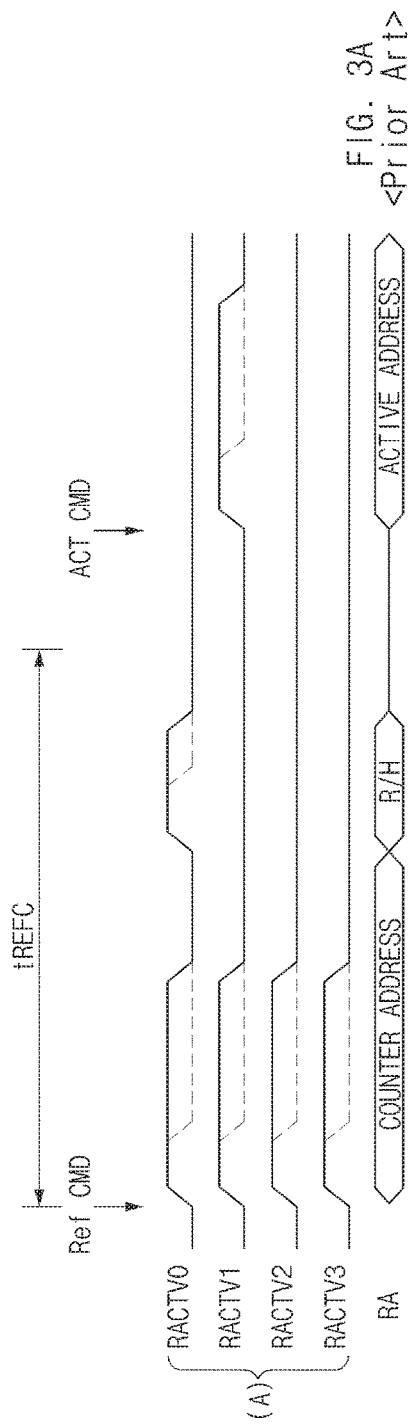
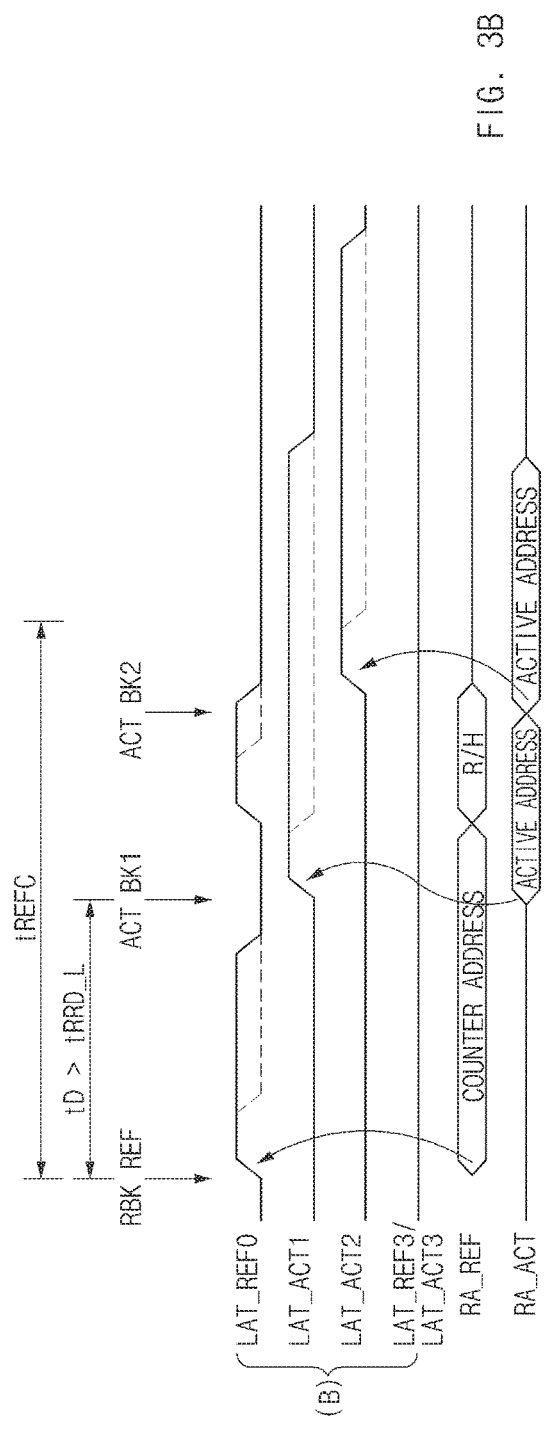
FIG. 3A
<Prior Art>
FIG. 3B

DEVICE FOR CONTROLLING A REFRESH OPERATION TO A PLURALITY OF BANKS IN A SEMICONDUCTOR DEVICE

CROSS-REFERENCES TO RELATED APPLICATION

The present application claims priority under 35 U.S.C. §119(a) to Korean application number 10-2016-0020579, filed on Feb. 22, 2016, in the Korean Intellectual Property Office, which is incorporated herein by reference in its entirety.

BACKGROUND

1. Technical Field

Various embodiments generally relate to a refresh control device, and more particularly, to a technology capable of reducing a timing margin error in a semiconductor device that performs a refresh for a bank.

2. Related Art

Recently, in mobile electronic products including smart phones, there are demands for a large capacity DRAM. In general, in a semiconductor memory device such as a DRAM, data stored in a memory cell may be changed by a leakage current. Therefore, in order to periodically recharge the data stored in the memory cell, a refresh operation is required.

That is, a memory cell of a dynamic semiconductor memory such as a DRAM stores data on a capacitive element. Due to charge leakage from the capacitive element, the memory cell should be periodically refreshed. Typically, the refresh process consists of a step of performing a read operation in order to take a level of charge stored in a memory cell as is.

Particularly, a semiconductor memory device such as a DDR SDRAM (Double Data Rate Synchronous DRAM) consists of a plurality of memory banks for storing data, wherein each of the plurality of memory banks consists of tens of millions or more of memory cells. Each of the memory cells consists of a cell capacitor and a cell transistor and the semiconductor memory device stores data through an operation for charging charge in the cell capacitor or discharging the charge.

The amount of the charge stored in the cell capacitor should be ideally constant at all times if there is no separate control. However, actually, due to a voltage difference with a peripheral circuit, the amount of the charge stored in the cell capacitor changes.

That is, in the state in which the cell capacitor has been charged, charge may be discharged or in the state in which the cell capacitor has been discharged, charge may be introduced. As described above, a change in the charge amount of the cell capacitor indicates a change in data stored in the cell capacitor, that is, indicates loss of the stored data. In order to substantially prevent data from being lost as described above, the semiconductor memory device performs a refresh operation.

With the passage of time, different types of refresh methods have been developed. In a normal auto-refresh method, a refresh timer exists outside a memory chip and the memory chip performs a refresh operation in response to a periodic refresh command supplied by a controller.

Furthermore, in a self-fresh method, a refresh timer exists inside a memory chip and all memory chips require a refresh start command from a controller.

SUMMARY

In an embodiment, a refresh control device may be provided. The refresh control device may include a plurality of latch circuits configured to receive an active signal, a refresh signal, an active control signal, and a refresh control signal, and output a word line enable signal for controlling a refresh operation to banks. The refresh control device may include a command decoder configured to decode a row address in correspondence to an external command signal and generate the active signal and the refresh signal. The refresh control device may include an address buffer configured to buffer an active address and generate the active control signal. The refresh control device may include an address control circuit configured to generate the refresh control signal in correspondence to a refresh command signal.

In an embodiment, a refresh control device may be provided. The refresh control device may include a first latch circuit configured to receive a first active signal, a first refresh signal, an active control signal, and a refresh control signal, and output a first word line enable signal to a first bank. The refresh control device may include a second latch circuit configured to receive a second active signal, a second refresh signal, the active control signal, and the refresh control signal, and output a second word line enable signal to a second bank. The refresh control device may include a command decoder configured to decode a row address in correspondence to an external command signal and generate the first active signal, the second active signal, the first refresh signal, and the second refresh signal. The refresh control device may include an address buffer configured to buffer an active address and generate the active control signal. The refresh control device may include an address control circuit configured to generate the refresh control signal in correspondence to a refresh command signal.

BRIEF DESCRIPTION OF THE DRAWINGS

FIG. 3A is a timing diagram for explaining a refresh operation according to the related art.

FIG. 3B is a timing diagram for explaining an example of an operation of a refresh control device of FIG. 1.

DETAILED DESCRIPTION

Various embodiments may be directed to a refresh control device and to reduce a timing margin error by separating an operation based on an active command from an operation based on a refresh command in a semiconductor device that performs refresh for each bank.

In an embodiment, in a semiconductor device that controls a refresh operation timing for each bank, an operation based on an active command and an operation based on a refresh command may be separated from each other, and an address may be exactly tuned with a command, so that it may be possible to reduce a timing margin error.

Hereinafter, a refresh control device will be described below with reference to the accompanying drawings through various examples of embodiments.

Figure 1:
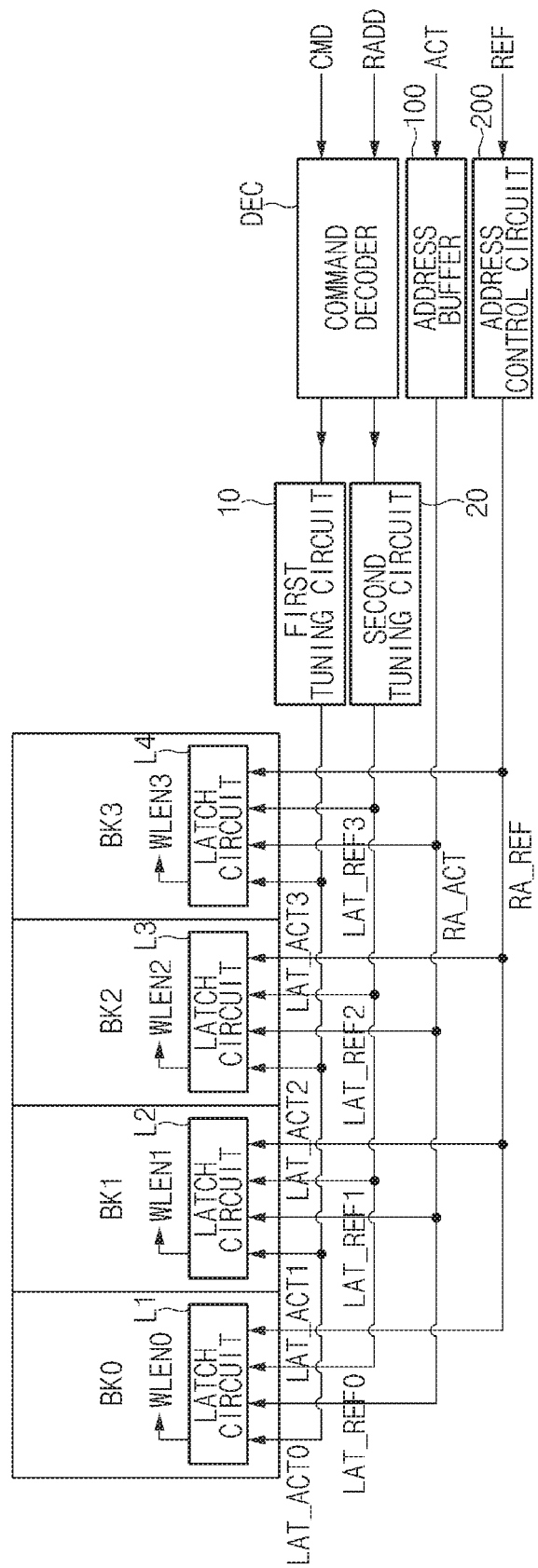
FIG. 1 is a circuit diagram illustrating a representation of an example of a refresh control device according to an embodiment.

FIG. 1 is a circuit diagram illustrating a representation of an example of a refresh control device according to an embodiment.

Referring to FIG. 1, the refresh control device may include a plurality of banks BK0 to BK3, a command decoder DEC, an address buffer 100, and an address control circuit 200.

The plurality of banks BK0 to BK3 may correspond to one bank group. The plurality of banks BK0 to BK3 include latch circuits L1 to L4, respectively, and a refresh operation is controlled for each bank.

The respective latch circuits L1 to L4 receive active signals LAT_ACT0 to LAT_ACT3, refresh signals LAT_REF0 to LAT_REF3, an active control signal RA_ACT, and a refresh control signal RA_REF, and output word line enable signals WLEN0 to WLEN3 for controlling a refresh operation.

For example, in the latch circuit L1, the active signal LAT_ACT0 and the refresh signal LAT_REF0 are separately inputted from the command decoder DEC. The active control signal RA_ACT and the refresh control signal RA_REF are applied to the latch circuit L1 from the address buffer 100 and the address control circuit 200, respectively. Such a latch circuit L1 outputs the word line enable signal WLEN0 for individually controlling a refresh operation of the bank BK0.

For example, in the latch circuit L2, the active signal LAT_ACT1 and the refresh signal LAT_REF1 are separately inputted from the command decoder DEC. The active control signal RA_ACT and the refresh control signal RA_REF are applied to the latch circuit L2 from the address buffer 100 and the address control circuit 200, respectively. Such a latch circuit L2 outputs the word line enable signal WLEN1 for individually controlling a refresh operation of the bank BK1.

For example, in the latch circuit L3, the active signal LAT_ACT2 and the refresh signal LAT_REF2 are separately inputted from the command decoder DEC. The active control signal RA_ACT and the refresh control signal RA_REF are applied to the latch circuit L3 from the address buffer 100 and the address control circuit 200, respectively. Such a latch circuit L3 outputs the word line enable signal WLEN2 for individually controlling a refresh operation of the bank BK2.

For example, in the latch circuit L4, the active signal LAT_ACT3 and the refresh signal LAT_REF3 are separately inputted from the command decoder DEC. The active control signal RA_ACT and the refresh control signal RA_REF are applied to the latch circuit L4 from the address buffer 100 and the address control circuit 200, respectively. Such a latch circuit L4 outputs the word line enable signal WLEN3 for individually controlling a refresh operation of the bank BK3.

As described above, in an embodiment, the operation line related to the active command and the operation line related to the refresh command are separated from each other. Accordingly, in an individual bank refresh operation, it may be possible to improve a timing margin of the refresh command and the active command.

A first tuning circuit 10 tunes a signal applied from the command decoder DEC and outputs the active signals LAT_ACT0 to LAT_ACT3 to the latch circuits L1 to L4. For example, the first tuning circuit 10 tunes a timing between the active signals LAT_ACT0 to LAT_ACT3 corresponding to the active command and the active control signal RA_ACT.

A second tuning circuit 20 tunes a signal applied from the command decoder DEC and outputs the refresh signals LAT_REF0 to LAT_REF3 to the latch circuits L1 to L4. For example, the second tuning circuit 20 tunes a timing between the refresh signals LAT_REF0 to LAT_REF3 corresponding to the refresh command and the refresh control signal RA_REF.

The command decoder DEC decodes a row address RADD in correspondence to an external command signal CMD, and generates the active signals LAT_ACT0 to LAT_ACT3 and the refresh signals LAT_REF0 to LAT_REF3. The address buffer 100 buffers an active address ACT to generate the active control signal RA_ACT. The address control circuit 200 generates the refresh control signal RA_REF in correspondence to a refresh command signal REF.

Recently, as the demands for mobile products such as cellular phones and PDAs (Personal Digital Assistants) are rapidly increased, efforts for reducing current consumption of a DRAM (Dynamic Random Access Memory) mounted in such mobile products have continued. Particularly, reducing a refresh current of a DRAM for mobile products is a big issue.

Among semiconductor memories, in the DRAM, information stored in a memory cell disappears with the passage of time differently from a SRAM (Static Random Access Memory) or a flash memory.

In order to substantially prevent such a problem, an operation for rewriting information stored in a cell at a predetermined cycle from an exterior may be performed, and such a series of operation may be called refresh.

The refresh is performed in such a manner that a word line is activated at least once within a retention time of each cell in a bank and data is sensed and amplified. The retention time indicates a time for which certain data is written in a cell and then may be substantially maintained without the refresh.

The refresh includes auto-refresh performed during a normal operation and self-refresh performed in a state of a power-down mode and the like. Between them, the self-refresh is performed by a self-refresh signal generated in a command decoder that receives a command signal and the like.

Figure 2:
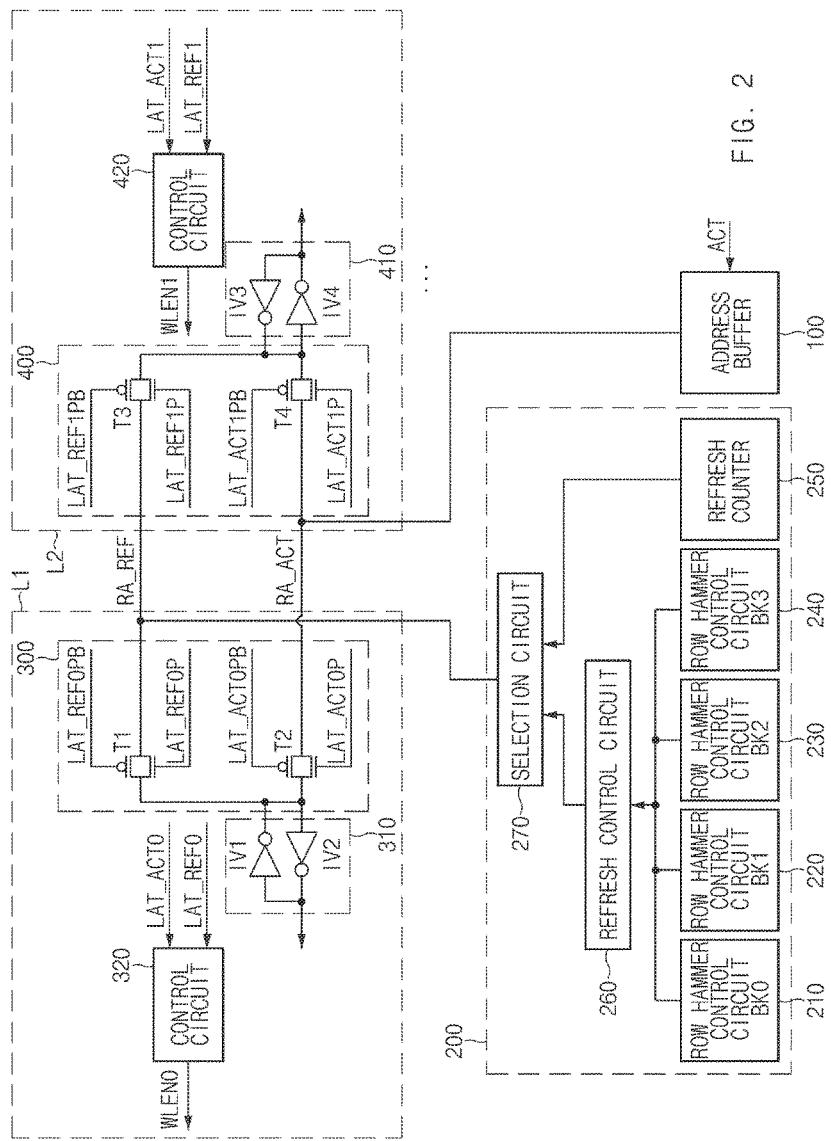
FIG. 2 is a configuration diagram illustrating a representation of an example of a latch circuit and an address control circuit of FIG. 1.

FIG. 2 is a configuration diagram illustrating a representation of an example of the latch circuits L1 and L2 and the address control circuit 200 of FIG. 1.

In an embodiment, the case in which the number of latch circuits L1 to L4 is four has been described as one example. However, in an embodiment, the number of latch circuits L1 to L4 is not limited. An embodiment of FIG. 2 illustrates only the configuration of the two latch circuits L1 and L2 of the four latch circuits L1 to L4.

The latch circuit L1 includes a signal transfer circuit 300, a latch 310, and a control circuit 320.

The signal transfer circuit 300 selectively outputs the refresh control signal RA_REF to the latch 310 in correspondence to refresh pulse signals LAT_REF0PB and LAT_REF0P. The refresh pulse signal LAT_REF0P is an inversion signal of the refresh pulse signal LAT_REF0PB. The refresh pulse signals LAT_REF0PB and LAT_REF0P are pulse signals which are transitioned to low and high levels whenever the refresh signal LAT_REF0 is applied.

The signal transfer circuit 300 selectively outputs the active control signal RA_ACT to the latch 310 in correspondence to active pulse signals LAT_ACT0PB and LAT_ACT0P. The active pulse signal LAT_ACT0P is an inversion signal of the active pulse signal LAT_ACT0PB.

Such a signal transfer circuit 300 includes transmission gates T1 and T2. The transmission gate T1 receives the refresh pulse signals LAT_REF0PB through a PMOS gate thereof, receives the refresh pulse signal LAT_REF0P through a NMOS gate thereof, and selectively outputs the refresh control signal RA_REF. The transmission gate T2 receives the active pulse signal LAT_ACT0PB through a PMOS gate thereof, receives the active pulse signal LAT_ACT0P through a NMOS gate thereof, and selectively outputs the active control signal RA_ACT.

The latch 310 latches an output signal of the signal transfer circuit 300 for a predetermined time and outputs a latched signal to the bank BK0. Such a latch 310 includes inverters IV1 and IV2 having a latch structure in which input terminals are respectively coupled to output terminals.

The control circuit 320 combines the active signal LAT_ACT0 with the refresh signal LAT_REF0 and outputs the word line enable signal WLEN0. For example, the control circuit 320 may perform a logic operation, for example an OR operation, on the active signal LAT_ACT0 and the refresh signal LAT_REF0 and output the word line enable signal WLEN0. For example, when the active signal LAT_ACT0 is activated or the refresh signal LAT_REF0 is activated, the control circuit 320 activates the word line enable signal WLEN0.

The latch circuit L2 includes a signal transfer circuit 400, a latch 410, and a control circuit 420.

The signal transfer circuit 400 selectively outputs the refresh control signal RA_REF to the latch 410 in correspondence to refresh pulse signals LAT_REF1PB and LAT_REF1P. The refresh pulse signal LAT_REF1P is an inversion signal of the refresh pulse signal LAT_REF1PB. The refresh pulse signals LAT_REF1PB and LAT_REF1P are pulse signals which are transitioned to low and high levels whenever the refresh signal LAT_REF1 is applied.

The signal transfer circuit 400 selectively outputs the active control signal RA_ACT to the latch 410 in correspondence to active pulse signals LAT_ACT1PB and LAT_ACT1P. The active pulse signal LAT_ACT1P is an inversion signal of the active pulse signal LAT_ACT1PB.

Such a signal transfer circuit 400 includes transmission gates T3 and T4. The transmission gate T3 receives the refresh pulse signals LAT_REF1PB through a PMOS gate thereof, receives the refresh pulse signal LAT_REF1P through a NMOS gate thereof, and selectively outputs the refresh control signal RA_REF. The transmission gate T4 receives the active pulse signal LAT_ACT1PB through a PMOS gate thereof, receives the active pulse signal LAT_ACT1P through a NMOS gate thereof, and selectively outputs the active control signal RA_ACT.

The latch 410 latches an output signal of the signal transfer circuit 400 for a predetermined time and outputs a latched signal to the bank BK1. Such a latch 410 includes inverters IV3 and IV4 having a latch structure in which input terminals are respectively coupled to output terminals.

The control circuit 420 combines the active signal LAT_ACT1 with the refresh signal LAT_REF1 and outputs the word line enable signal WLEN1. For example, the control circuit 420 may perform a logic operation, for example an OR operation, on the active signal LAT_ACT1 and the refresh signal LAT_REF1 and output the word line enable signal WLEN1. For example, when the active signal LAT_ACT1 is activated or the refresh signal LAT_REF1 is activated, the control circuit 420 activates the word line enable signal WLEN1.

The address control circuit 200 includes a plurality of row hammer control circuits 210, 220, 230, and 240, a refresh counter 250, a refresh control circuit 260, and a selection circuit 270.

Each of the plurality of row hammer control circuits 210, 220, 230, and 240 controls a row hammer operation for each of the banks BK0 to BK3. The refresh control circuit 260 outputs a control signal for controlling a refresh operation in correspondence to a refresh command signal REF and output of the row hammer control circuits 210, 220, 230, and 240. In a refresh mode, the refresh counter 250 counts and outputs a refresh address.

Since data stored in a semiconductor device, for example, a DRAM, disappears by a leakage current, the data of the cell is sensed and amplified and then data is rewritten in the cell, and such an operation is called refresh. When an external control signal enters into a predetermined state and then is continued without a change in its state, a scheme in which refresh is periodically performed in the device may be called self-refresh.

Whenever a refresh command is generated, the refresh counter 250 sequentially counts addresses for accessing memory cells in which a refresh operation is performed. Accordingly, a self-refresh operation for a memory cell accessed by the address is sequentially performed.

The selection circuit 270 selects any one of output of the refresh control circuit 260 and output of the refresh counter 250, and generates the refresh control signal RA_REF. The selection circuit 270 selects the output of the refresh control circuit 260 when the refresh operation is performed for each bank by reflecting the row hammer operation of each of the banks BK0 to BK3. However, in a normal refresh operation, the selection circuit 270 selects the output of the refresh counter 250.

In a semiconductor device, a row access operation may be largely classified into an active operation and a refresh operation. These two operations use addresses of sources different from each other.

That is, when an active command is applied, an active address ACT applied from an exterior is applied to the address buffer 100. However, when a refresh command is applied, the row access operation may be performed through the refresh control signal RA_REF generated in the address control circuit 200 in the semiconductor device.

FIG. 3A is a timing diagram for explaining a refresh operation according to the related art. FIG. 3B is a timing diagram for explaining an example of the operation of the refresh control device of FIG. 1.

FIG. 3A illustrates a refresh operation timing according to the related art, and FIG. 3B illustrates a refresh operation timing according to an embodiment.

In the related art, when a refresh command signal REF is activated, active signals RACTV0 to RACTV3 for all banks are activated as illustrated in (A) of FIG. 3A. That is, in the related art, in an active operation and a refresh operation, a row access operation is performed by the active signals RACTV0 to RACTV3.

Furthermore, when the refresh command signal REF is activated, a refresh counter counts a row address RA, so that a refresh operation is performed by a counter address. In a row hammer operation, only one selected bank is activated by the active signal RACTV0.

Thereafter, after a preset refresh time tREFC passes, an active command ACT is applied. Then, another selected bank is activated by the active signal RACTV1 and an active address is applied.

However, in the refresh control scheme according to the related art, an address and a command using sources different from each other are controlled by the active signals RACTV0 to RACTV3. Therefore, a margin between the active command and the row address and a margin between the refresh command and the refresh address may be mismatched with each other.

Recently, in order to improve the operation efficiency of a system, a per-bank refresh scheme enabling an independent refresh operation for each bank has been mainly used.

In an embodiment, an individual bank refresh command signal PBK REF for individually controlling each of the banks BK0 to BK3 is activated. Then, all banks are not activated, and an individual refresh or active operation is performed for each of the banks BK0 to BK3.

For example, as illustrated in (B) of FIG. 3B, the refresh signal LAT_REF0 is activated, so that a refresh operation is performed in the bank BK0 in correspondence to the counter address of the refresh control signal RA_REF. That is, during the preset refresh time tREFC, the refresh operation is sequentially performed by the output of the refresh counter 250.

Thereafter, when a continuous active command is inputted, if a time RAS-to-RAS delay (tRRD_L), which is a period from the input of a first active command to the input of a next active command, passes (a time D, tD), an active signal ACT BK1 of the bank BK1 is activated. Furthermore, a row access operation for the banks BK0 to BK3 in substantially the same bank group may be performed in the period tRRD_L.

Then, the active signal LAT_ACT1 and the active control signal RA_ACT are activated, so that the active operation of the bank BK1 is performed. In this case, during the preset refresh time tREFC, a row hammer (R/H) operation of the bank BK0 may be performed regardless of the active operation of the bank BK1.

For example, when a refresh operation is performed once during the preset refresh time tREFC and there is a remaining time, a weak cell may be additionally refreshed by row hammer during the remaining time. Consequently, it may be possible to efficiently manage a data retention time of a cell.

In the related art, in a refresh operation of all banks, the active command may not be applied during the preset refresh time tREFC. However, in an embodiment, in the individual bank refresh operation, operations such as row hammer refresh and weak cell refresh may be simultaneously performed.

Then, when an active signal ACT BK2 of the bank BK2 is activated, the active operation of the bank BK2 is performed by the active signal LAT_ACT2 and the active control signal RA_ACT. As described above, in an embodiment, it is possible to individually perform the refresh operation and the active operation of each of the banks BK0 to BK3 in substantially the same bank group.

Figure 4:
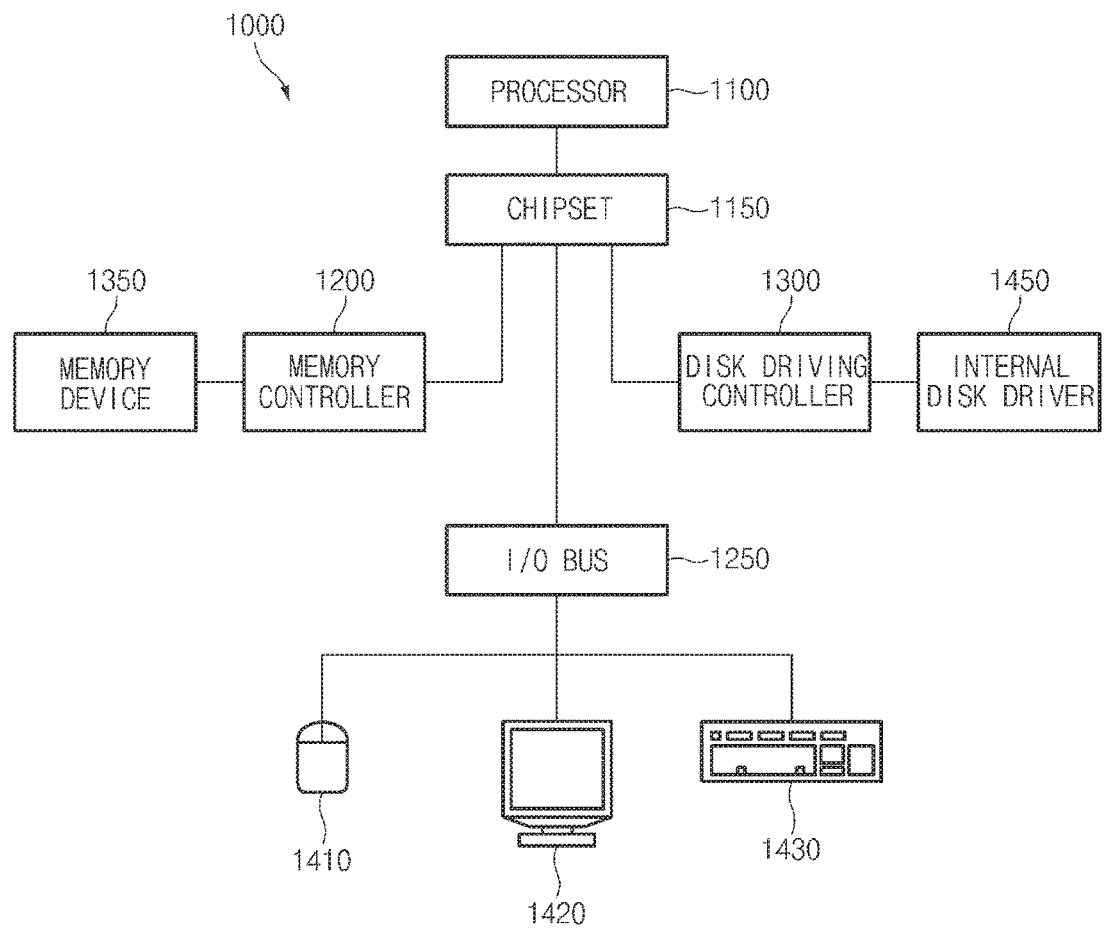
FIG. 4 illustrates a block diagram of an example of a representation of a system employing a refresh control device with the various embodiments discussed above with relation to FIGS. 1, 2, and 3B.

The refresh control devices as discussed above (see FIGS. 1, 2, and 3B) are particular useful in the design of memory devices, processors, and computer systems. For example, referring to FIG. 4, a block diagram of a system employing a refresh control device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driving controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one refresh control device as discussed above with reference to FIGS. 1, 2, and 3B. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one refresh control device as discussed above with relation to FIGS. 1, 2, and 3B, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driving controller 1300 may be operably coupled to the chipset 1150. The disk driving controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driving controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 4 is merely one example of a system 1000 employing a refresh control device as discussed above with relation to FIGS. 1, 2, and 3B. In alternate embodiments, such as, for example but not limited to, cellular phones or digital cameras, the components may differ from the embodiments illustrated in FIG. 4.

While various embodiments have been described above, it will be understood to those skilled in the art that the embodiments described are by way of example only. Accordingly, the refresh control device described herein should not be limited based on the described embodiments.

What is claimed is:

1. A refresh control device comprising:
   a plurality of latch circuits configured to receive an active signal, a refresh signal, an active control signal, and a refresh control signal, and output a word line enable signal for controlling a refresh operation for a plurality banks;
   a command decoder configured to decode a row address in correspondence to an external command signal and generate the active signal and the refresh signal;
   an address buffer configured to buffer an active address and generate the active control signal; and
   an address control circuit configured to generate the refresh control signal in correspondence to a refresh command signal,
   wherein the address control circuit comprises:
   a plurality of row hammer control circuits configured to control a row hammer operation for the banks;
   a refresh counter configured to count a refresh address in a refresh mode;
   a refresh control circuit configured to output a control signal for controlling a refresh operation in correspondence to a refresh command signal and output of the plurality of row hammer control circuits; and
   a selection circuit configured to select any one of output of the refresh counter and output of the refresh control circuit and output the refresh control signal.

2. The refresh control device of claim 1, wherein the plurality of latch circuits are provided in a plurality of banks in a one-to-one manner.

3. The refresh control device of claim 1, further comprising:
   a first tuning circuit configured to tune output of the command decoder and output the active signal.

4. The refresh control device of claim 1, further comprising:
   a second tuning circuit configured to tune output of the command decoder and output the refresh signal.

5. The refresh control device of claim 1, wherein each of the plurality of latch circuits comprises:
   a signal transfer circuit configured to selectively output the refresh control signal in correspondence to a refresh pulse signal and selectively output the active control signal in correspondence to an active pulse signal;
   a latch configured to latch an output signal of the signal transfer circuit for a predetermined time and output a latched signal to a bank; and
   a control circuit configured to combine the active signal with the refresh signal and output the word line enable signal.

6. The refresh control device of claim 5, wherein the signal transfer circuit comprises:
   a first transmission gate configured to selectively transfer the refresh control signal by a first refresh pulse signal and a second refresh pulse signal which is an inversion signal of the first refresh pulse signal; and
   a second transmission gate configured to selectively transfer the active control signal by a first active pulse signal and a second active pulse signal which is an inversion signal of the first active pulse signal.

7. The refresh control device of claim 5, wherein the refresh pulse signal is a pulse signal which is transitioned to a low or high level whenever the refresh signal is applied.

8. The refresh control device of claim 5, wherein the active pulse signal is a pulse signal which is transitioned to a low or high level whenever the active signal is applied.

9. The refresh control device of claim 5, wherein the control circuit performs a logic operation on the active signal and the refresh signal and outputs the word line enable signal.

10. The refresh control device of claim 1, wherein the selection circuit selects the output of the refresh control circuit when a refresh operation is performed for each bank by reflecting the row hammer operation of each of the banks, and selects the output of the refresh counter in a normal refresh operation.

11. The refresh control device of claim 1, wherein the banks respectively including the plurality of latch circuit are included in one bank group.

12. A refresh control device comprising:
    a first latch circuit configured to receive a first active signal, a first refresh signal, an active control signal, and a refresh control signal, and output a first word line enable signal to a first bank;
    a second latch circuit configured to receive a second active signal, a second refresh signal, the active control signal, and the refresh control signal, and output a second word line enable signal to a second bank;
    a command decoder configured to decode a row address in correspondence to an external command signal and generate the first active signal, the second active signal, the first refresh signal, and the second refresh signal;
    an address buffer configured to buffer an active address and generate the active control signal; and
    an address control circuit configured to generate the refresh control signal in correspondence to a refresh command signal,
    wherein the address control circuit comprises:
    a plurality of row hammer control circuits configured to control a row hammer operation for the first and second banks;
    a refresh counter configured to count a refresh address in a refresh mode;
    a refresh control circuit configured to output a control signal for controlling a refresh operation in correspondence to a refresh command signal and output of the plurality of row hammer control circuits; and
    a selection circuit configured to select any one of output of the refresh counter and output of the refresh control circuit and output the refresh control signal.

13. The refresh control device of claim 12, further comprising:
    a first tuning circuit configured to tune output of the command decoder and output the first active signal and the second active signal.

14. The refresh control device of claim 12, further comprising:
    a second tuning circuit configured to tune output of the command decoder and output the first refresh signal and the second refresh signal.

15. The refresh control device of claim 12, wherein each of the first latch circuit and the second latch circuit comprises:
    a signal transfer circuit configured to selectively output the refresh control signal in correspondence to a refresh pulse signal and selectively output the active control signal in correspondence to an active pulse signal;

a latch configured to latch an output signal of the signal transfer circuit for a predetermined time and output a latched signal to a bank; and a control circuit configured to perform a logic operation on an active signal and a refresh signal and output a word line enable signal.

16. The refresh control device of claim 15, wherein the refresh pulse signal is a pulse signal which is transitioned to a low or high level whenever the refresh signal is applied.

17. The refresh control device of claim 15, wherein the active pulse signal is a pulse signal which is transitioned to a low or high level whenever the active signal is applied.

18. The refresh control device of claim 12, wherein the selection circuit selects the output of the refresh control circuit when a refresh operation is performed for each of the first and second banks by reflecting the row hammer operation of each of the first and second banks, and selects the output of the refresh counter in a normal refresh operation.

* * * * *